(12) United States Patent
Devasahayam et al.

(10) Patent No.: US 6,573,720 B1
(45) Date of Patent: Jun. 3, 2003

(54) RESONANT STRUCTURE FOR SPATIAL AND SPECTRAL-SPATIAL IMAGING OF FREE RADICAL SPIN PROBES USING RADIOFREQUENCY TIME DOMAIN ELECTRON PARAMAGNETIC RESONANCE SPECTROSCOPY

(75) Inventors: Nallathamby Devasahayam, Rockville, MD (US); James B. Mitchell, Damascus, MD (US); Angelo Russo, Bethesda, MD (US); John Cook, New Market, MD (US); Mobae Afeworki, Silver Spring, MD (US); Rolf G. Tschudin, Kensington, MD (US); Sankaran Subramanian, Rockville, MD (US); Ramachandran Murugesan, Rockville, MD (US); Frank S. Harrington, Catonsville, MD (US); Murali K. Cherukuri, Gaithersburg, MD (US)

(73) Assignee: The United States of America as represented by the Department of Health and Human Services, Washington, DC (US)

( * ) Notice: Subject to any disclaimer, the term of this patent is extended or adjusted under 35 U.S.C. 154(b) by 0 days.

(21) Appl. No.: 09/424,558

(22) PCT Filed: May 21, 1998

(86) PCT No.: PCT/US98/10467

§ 371 (c)(1),
(2), (4) Date: Apr. 10, 2000

(87) PCT Pub. No.: WO98/54590

PCT Pub. Date: Dec. 3, 1998

Related U.S. Application Data
(60) Provisional application No. 60/047,786, filed on May 27, 1997.

(51) Int. Cl.$^7$ .................................................. G01V 3/00
(52) U.S. Cl. ........................................ 324/316; 324/318
(58) Field of Search ................................. 324/316, 318, 324/322

(56) References Cited

U.S. PATENT DOCUMENTS

| | | | | |
|---|---|---|---|---|
| 4,755,754 A | * | 7/1988 | Sireul et al. | 324/318 |
| 4,891,593 A | * | 1/1990 | Lurie et al. | 324/307 |
| 5,387,867 A | * | 2/1995 | Bourg et al. | 324/316 |
| 5,502,386 A | * | 3/1996 | Bourg et al. | 324/316 |
| 5,578,922 A | * | 11/1996 | Lurie et al. | 324/307 |
| 5,621,322 A | * | 4/1997 | Ehnholm | 324/318 |
| 5,678,548 A | * | 10/1997 | Murugesan et al. | 600/410 |
| 5,865,746 A | * | 2/1999 | Murugesan et al. | 600/410 |
| 5,882,304 A | * | 3/1999 | Ehnholm et al. | 600/411 |
| 6,150,817 A | * | 11/2000 | Lurie et al. | 324/318 |

* cited by examiner

Primary Examiner—Edward Lefkowitz
Assistant Examiner—Dixomara Vargas
(74) Attorney, Agent, or Firm—Townsend & Townsend & Crew LLP

(57) ABSTRACT

A radiofrequency (RF) coil design, suitable for detecting time domain electron paramagnetic resonance (EPR) responses from spin probes after pulsed excitation using radiofrequency irradiation (60–400 MHz), is configured in an array of numerous surface coils of appropriate diameters connected in a parallel or axial configuration with appropriate spacing between individual surface coils to form a volume type resonator.

4 Claims, 6 Drawing Sheets

RESONANT STRUCTURE FOR SPATIAL AND SPECTRAL-SPATIAL IMAGING OF FREE RADICAL SPIN PROBES USING RADIOFREQUENCY TIME DOMAIN ELECTRON PARAMAGNETIC RESONANCE SPECTROSCOPY

This application claims the benefit of Provisional Application No. 60/047,786, filed May 27, 1997.

BACKGROUND OF THE INVENTION

1. Field of the Invention

The present invention relates generally to electron paramagnetic resonance (EPR) resonance spectroscopy systems and, more particularly, relates to improved resonators for use in such systems.

Resonator coils are used to detect magnetic resonance responses from infusible or implantable spin probes in living objects after pulsed excitation using radiofrequency, in the range 60–400 MHz, of the sample placed in a magnetic field. With the addition of gradient fields to the stationary magnetic field, the responses are collected for image reconstruction purposes.

2. Description of the Relevant Art

In electron paramagnetic resonance (EPR) spectroscopy, a uniform magnetic field Bo is applied to an object to align the magnetic moments of the electrons along the Z-axis of the applied magnetic field (C. P. Poole Jr, *Electron Spin Resonance*, 2nd Ed., Wiley, NY). An EPR spectroscopy system is described in a co-assigned patent application to Murugesan et al. (Ser. No. 08/504,616 filed Jul. 20, 1995) which is hereby incorporated by reference for all purposes. For a single electron system the spins are in either of the two levels, a higher and lower energy level. Electromagnetic radiation of appropriate frequency can cause absorption of energy by inducing transitions between the two states, a process called electron paramagnetic resonance (EPR). This process is similar to nuclear magnetic resonance where the nuclear spin systems such as protons are studied in a similar manner.

The frequency of operation is related to the magnetic moment of the spin system, and the applied magnetic field or the frequency of the incident RF radiation and is given by the equation:

$$2\pi v_0 = v_e B_0$$

where $v_0$ is the frequency of operation, $B_0$ is the applied magnetic field, and $v_e$ is the gyromagnetic ratio of the spin system. Since the g for electrons is nearly 660 times greater in magnitude than that of a proton, a correspondingly lower applied magnetic field compared to proton NMR is necessary for a given frequency of operation.

After radiofrequency irradiation pulses of suitable duration and intensity are used to irradiate a sample containing unpaired electrons in a resonator coil, weak resonance signals, called "free induction decays," (FIDs) which decay in amplitude as a function of time, are detected by the same resonator coil, which also serves as a receiver. The FID is converted to a resonance absorption signal by mathematical transformation called the Fourier transformation.

For proton NMR, the pulse widths of irradiation are in the microsecond range and the FIDs last for times ranging from milliseconds to seconds. For free electron spin probes such as free radicals, the corresponding excitation pulse widths are typically in the range of 10 to 100 ns, and the FIDs last between 100 ns to 20 µs.

The purpose of the resonator coil is to deliver the transmitted power into the spin system to create and receive resonance signals.

Coupling the input power efficiently into the spin system and recovering the resonance signals at optimal strength will have a significant influence in the quality of images obtained. Several resonators exist for Electron Paramagnetic Resonance (EPR) practiced at frequencies in the range of 9 GHz and above (Pfenninger et. al., "General Method for Adjusting the Q-factor of EPR Resonators," *Rev. Sci. Instr.* vol 68, 4857–4865, 1995; Prisner et. al., "Pulsed 95 GHz High Field EPR Heterodyne Spectrometer with High Spectral and Time Resolution," *Appl. Magn. Reson.* 7, 167–183 1994). These resonators are not suitable for studies involving living objects due to the small volumes available in which to place the object under study. The resonators used in MRI using protons as spin probes are suitable in terms of size but not in terms of electrical characteristics such as the resonator dead time (R S Withers and G C Liang, U.S. Pat. No. 5,276,398 dated Jan. 4, 1994).

The dead time is the time taken for the noise originating from the intense input power to the resonator housing the object under study to return to thermal noise levels and is given by the equation:

$$T_D = t \, Q/2\pi v_0$$

where t is the time constant for the noise dissipation, Q is the quality factor of the resonator and $v_0$ is the operating frequency (Pfenninger et. al., "General Method for Adjusting the Q-factor of EPR Resonators," *Rev. Sci. Instr.* vol 68, 4857–4865, 1995). Only after the resonator dissipates the noise associated with the intense input power can the rapidly decaying weak signals associated with the resonance absorption be recovered.

The dead times are not an important factor in MRI, since the signals associated with the resonance absorption of the nuclei are long lived (in the order of seconds) permitting dead times in the order of micro- to milliseconds. In addition, in MRI, since the spectral bandwidth is extremely narrow (<10 kHz), resonators of high Q-values are desirable for enhanced sensitivity (R S Withers and G C Liang, U.S. Pat. No. 5,276,398 dated Jan. 4, 1994).

For time domain EPR experiments, the lower the frequency, the longer is the time required for the receiver to recover after the dead time. In addition, the spectral band width of EPR is in the order of 5–10 MHz. These two factors limit the resonator Q-values to less than 50.

The input power (P) to be given to the spin system to provide a given magnitude of the magnetic field $B_1$ is dependent on both the Q-value of the resonator and the volume V of the resonator and is given by the expression:

$$P = \text{constant } (V/Q).$$

Accordingly, spin systems in resonators with lower Q values provide correspondingly lower resonance signals compared to resonators having higher Q values. In addition, the increased volumes necessary for studying living objects necessitates the use of resonators with correspondingly increased volumes. This causes an added demand on the input power to achieve a given magnetic component ($B_1$) of the RF (Prisner et. al., "Pulsed 95 GHz High Field EPR Heterodyne Spectrometer with High Spectral and Time Resolution," *Appl. Magn. Reson.* 7, 167–183 1994).

Lowering the Q-value by overcoupling has been suggested to be desirable over resistively lowering the Q for resonators for EPR experiments conducted at X-band frequency so as to minimize the Q-value without decreasing the effective $B_1$ field at a given input power (Rinard et. al., "Relative Benefits of Overcoupled Resonators vs. Inherently Low-Q Resonators for Pulsed Magnetic Resonance," *J. Magn. Reson. A* 108, 71–81, 1994). Two helical coils connected in parallel and overcoupled to lower the Q have been implemented for NMR (Chingas, "Overcoupling NMR Probes to Improve Transient Response," *J. Magn. Reson.* 54, 153–157, 1983). However, since the demands of time domain RF EPR in terms of decreased dead times, effective $B_1$ field, RF penetration and enhanced sensitivity, the available designs were found not to be adequate.

SUMMARY OF THE INVENTION

An object of the present invention is to provide a family of resonator coils necessary to accommodate and irradiate objects of interest of varying dimensions, such as living objects, containing free radical spin probes and induce an EPR signal which can also be recovered by the resonator. Such a resonator has the capability of facilitating the enhanced dissipation of noise to thermal noise levels associated with the input power from the RF pulse, and recovering weak and rapidly decaying FIDs. In addition, the lowering of the Q values by overcoupling, instead of resistively damping provides enhanced $B_1$ fields thereby increasing the sensitivity of detection of the resonance signals after pulsed excitation.

According to one aspect of the invention, a radiofrequency (RF) coil design suitable for detecting time domain electron paramagnetic resonance (EPR) responses from spin probes after pulsed excitation using radiofrequency irradiation (60–400 MHz) is provided. The coil is configured in an array of numerous surface coils of appropriate diameters connected in a parallel configuration with appropriate spacing between individual surface coils to form a volume type resonator. Such resonators are suitable for detecting time domain EPR signals after pulsed excitation from spin probes in a living object. Such resonators can also be utilized for collecting EPR responses under gradient magnetic fields and processed for image reconstruction. Since the dead time of the resonator and the spectral window provided by the resonator are critical for the success of the imaging techniques using time domain EPR experiments, the resonator design provides for a lower dead time and broad band Q profile as well as acceptable uniformity in RF irradiation to provide images of free radical distribution from a living object or objects within the resonator (paper entitled "In vivo Imaging of a Stable Paramagnetic Probe by Pulsed-Radiofrequency Electron Paramagnetic Resonance Spectroscopy," Murugesan et. al., *Magnetic Resonance in Medicine*, 1997).

According to another aspect of the invention, coils are oriented axially with respect to a cylindrical tube and coupled in parallel to receive RF energy.

The present invention has abilities to effectively couple the input power to the spin system, shorten the dead time and also pick up the weak and rapidly decaying resonance signals associated with free radical spin probes. The design provides ability to fabricate resonators of appropriate dimensions to study living objects.

According to another aspect of the invention, Q-switching is utilized to increase the sensitivity of the resonator.

Other features and advantages will be apparent in view of the following detailed description and appended drawings.

DESCRIPTION OF THE PREFERRED EMBODIMENT

Figure 1:
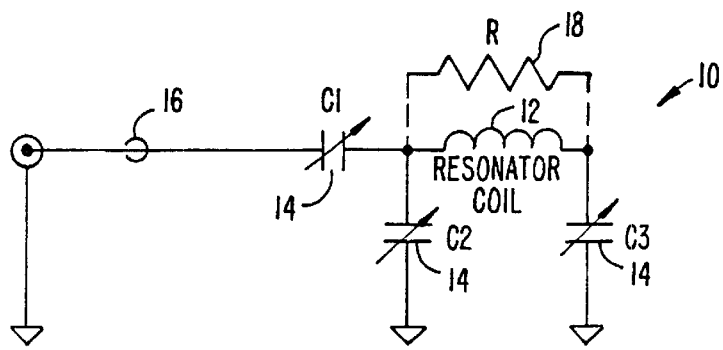
FIG. 1 shows the electrical circuit diagram of the resonator.

FIG. 1 is an electrical schematic diagram depicting the components of a preferred embodiment of the resonator 10 of the invention. In FIG. 1, the resonator 10 includes a resonant coil 12 and capacitors 14 forming a resonant circuit. The resonant frequency of the resonator 10 can be tuned and matched with the capacitors C1, C2, C3. The matching of the resonance circuit to the source and input cable 16 so as to transfer the maximum power to the resonance structure is achieved by varying the capacitance values of the matching capacitors C1 and C3.

In practice, the varying of the capacitors for tuning 14 and matching has to be optimized so as to achieve the required frequency and matching impedance. A resistor R 18 is included in the system to reduce the ringing time (dead time). This also helps to bring down the Q.

Figure 2:
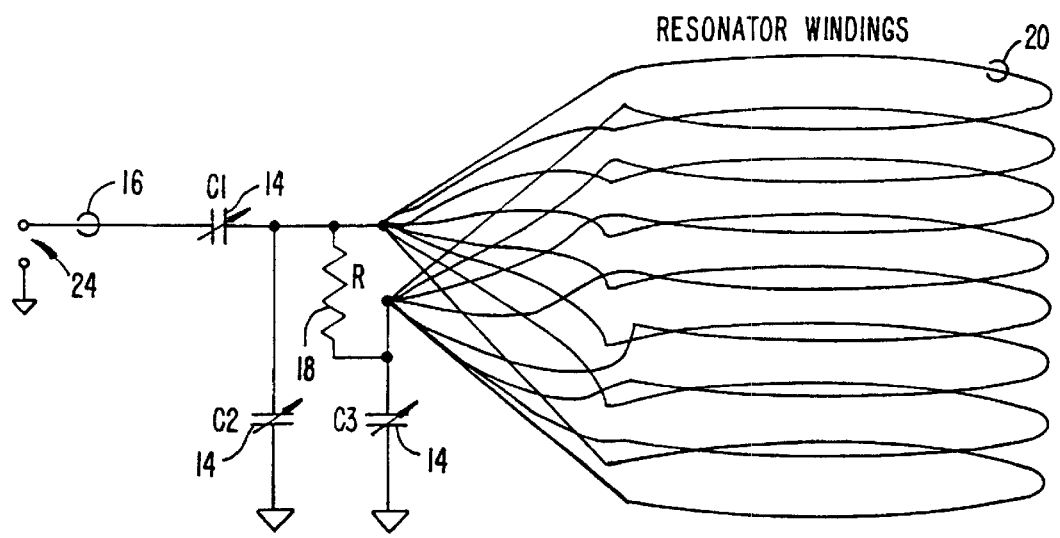
FIG. 2 is a perspective view of the winding of the coil of a first embodiment of the resonator, many individual coils which are connected in parallel are shown.

FIG. 2 provides a detailed schematic of the coil positioning and winding. From the coil configuration it can be understood that there are many individual coils elements 20 which are connected in parallel to form an array which functions as the resonant coil 12. The circumference of the coil elements 20 in the array are equal. Similarly, connecting leads 24 are also kept equal so that there is no phase error during the application of the radio frequency.

The number of solenoidal coil elements 20 and the space between them depends on the diameter of the probe being constructed. The variation in number and space is such that the required inductance can be achieved for tuning and matching for the required frequency.

Figure 3:
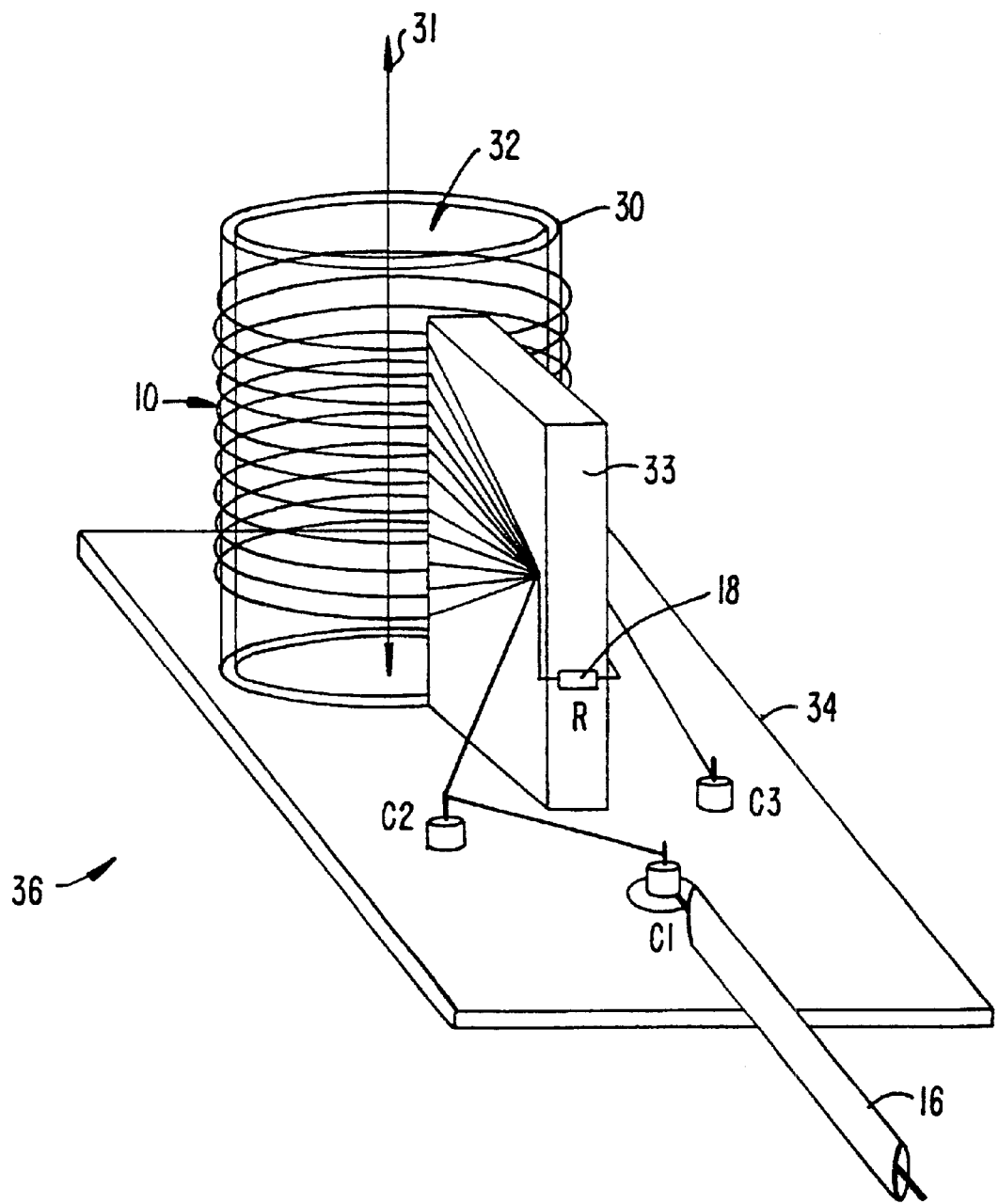
FIG. 3 is a view of the coil from the bottom, showing the winding of the coil elements and how they are connected to the capacitors.

FIG. 3 is a perspective view from below of a preferred embodiment of the invention. In FIG. 3, the coil elements are wound about and supported on a dielectric mandrel 30 in the form of a plastic tube having a long axis 31. The interior of the tube 30 forms the cavity 32 into which a sample is placed.

The connecting leads are supported by a dielectric separator 33 which provides RF shielding between the input and output connecting leads. The resonant structure 10 and capacitors 14 are mounted on a base 34 constructed of glass epoxy and copper coated on both sides to form a resonator assembly 36. The resistor 18 is included in the connection between C1 and C2.

In a test configuration, 11 coil elements of radius 90 mm were spaced vertically about 2.5 mm apart. The circuit elements had the following values:

C1=9.7 pf;
C2=18 pf;
C3=14.5 pf;
R=2.2 kohms;

In this configuration the inductance of the resonant structure is 0.031 microH. Based on the principles of operation, the resonant structure 10 should be scalable to encompass a human head for EPR studies. The input power to the coil is connected through SMA semi rigid cable 16.

Figure 4:
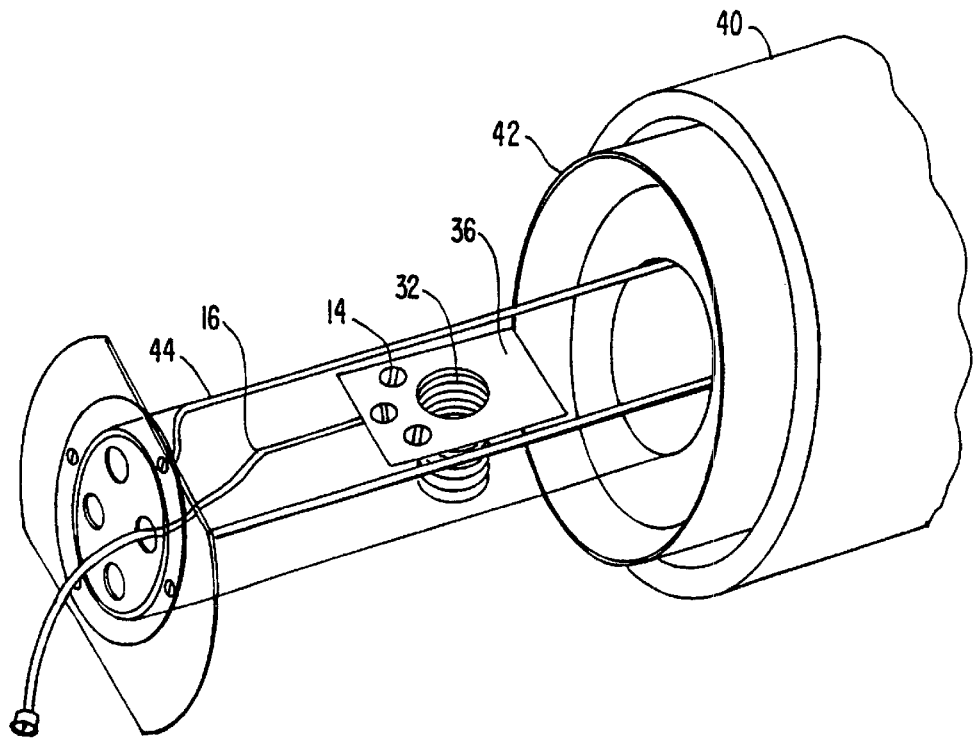
FIG. 4 shows final positioning of the first embodiment structure in the magnet with gradient coil.

FIG. 4 is a perspective view of the mounting of the resonator structure 36 in the system. A Helmholtz coil magnet 40 and mounted gradient coils 42 are depicted. The sample assembly 44 can be slid in after loading the sample in the resonator 10. The first embodiment of the resonant structure 36 is mounted in the center position of the magnet 40 when the whole assembly 44 is inserted inside the magnet 40. The sample will be loaded in the cavity 32 of the resonance structure 10. The power to the resonator is given through the coaxial and semirigid cable assembly 16.

Figure 5:
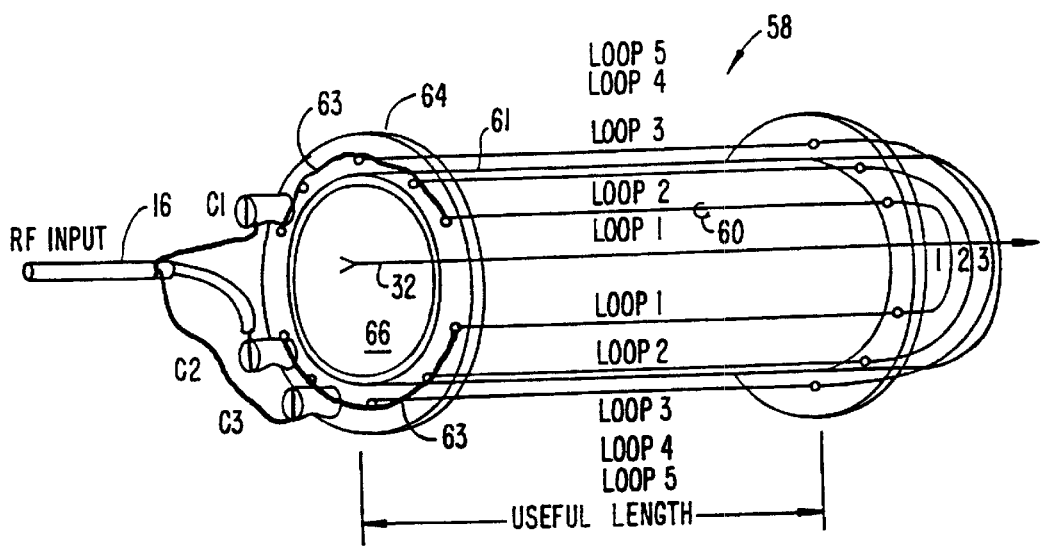
FIG. 5 is a perspective view of the winding of the coil of a second embodiment of the resonator, many individual coils which are axially oriented are shown.
Figure 6:
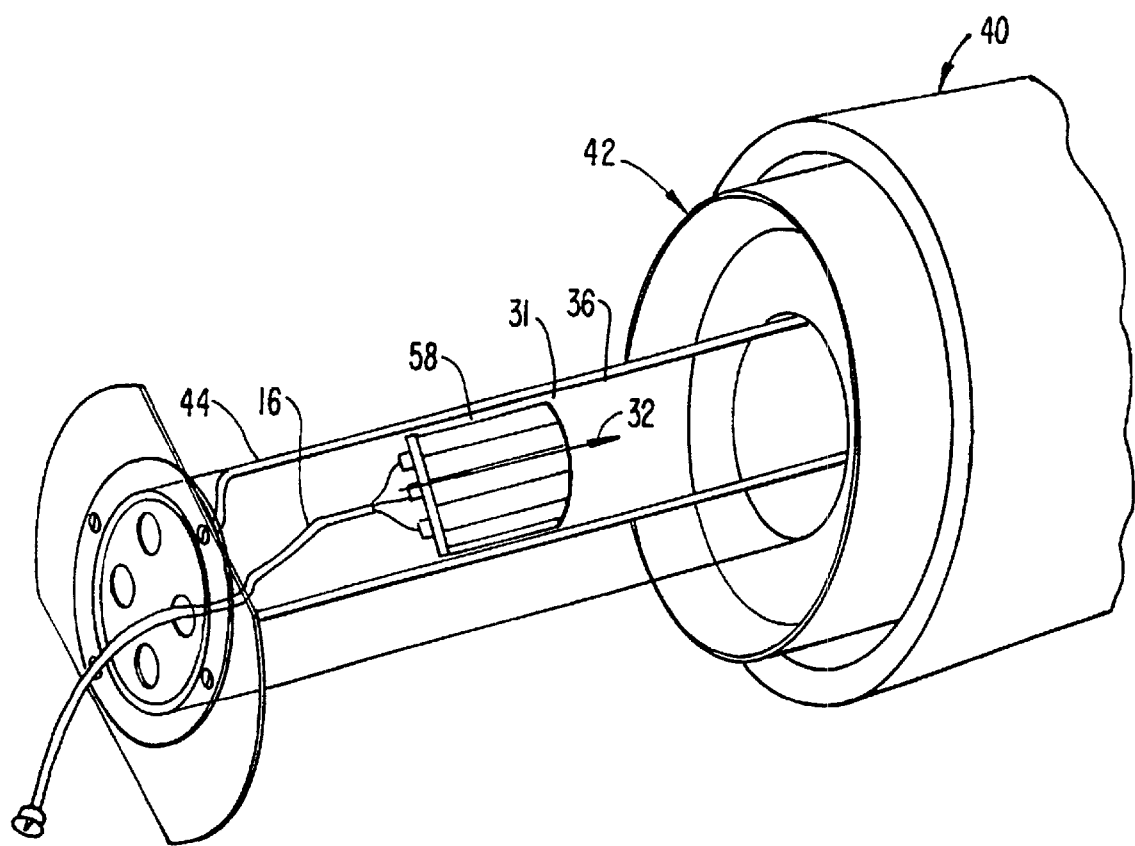
FIG. 6 shows final positioning of the second embodiment structure in the magnet with gradient coil.

A second preferred embodiment 58 of the resonant structure is depicted in FIG. 5. In the embodiment of FIG. 5 coil loop elements 60 are wound lengthwise about a tube 61 so wires of the coil loops 60 running along the tube 61 are parallel to the long axis 32. Conducting leads 63 are run along a bottom flange 64 of the tube 61 upon which are mounted the tuning and matching capacitors C1, C2, and C3. The leads 63 are connected in parallel to the coil elements 60 so that all magnetic fields are in phase. A sample is placed in the cavity 66 formed by the interior of the tube.

The resonator is shielded with a mesh-like outer covering (not shown) to reduce RF interference from extraneous sources. Each of the resonator loopings 60 is extended outward to longer lengths that the length of the cylindrical support 61 to provide uniform RF flux in the usable range of the tube 61. Any number of coil loops 60 can be added and the size of the tube can be scaled up for accommodating human anatomy and large objects.

The Q of the resonator is kept at about 25 for applications requiring large spectral coverage. For applications requiring narrow spectral coverage (around 100 kHz) high Q resonators can be implemented using the same configuration.

Figure 7:
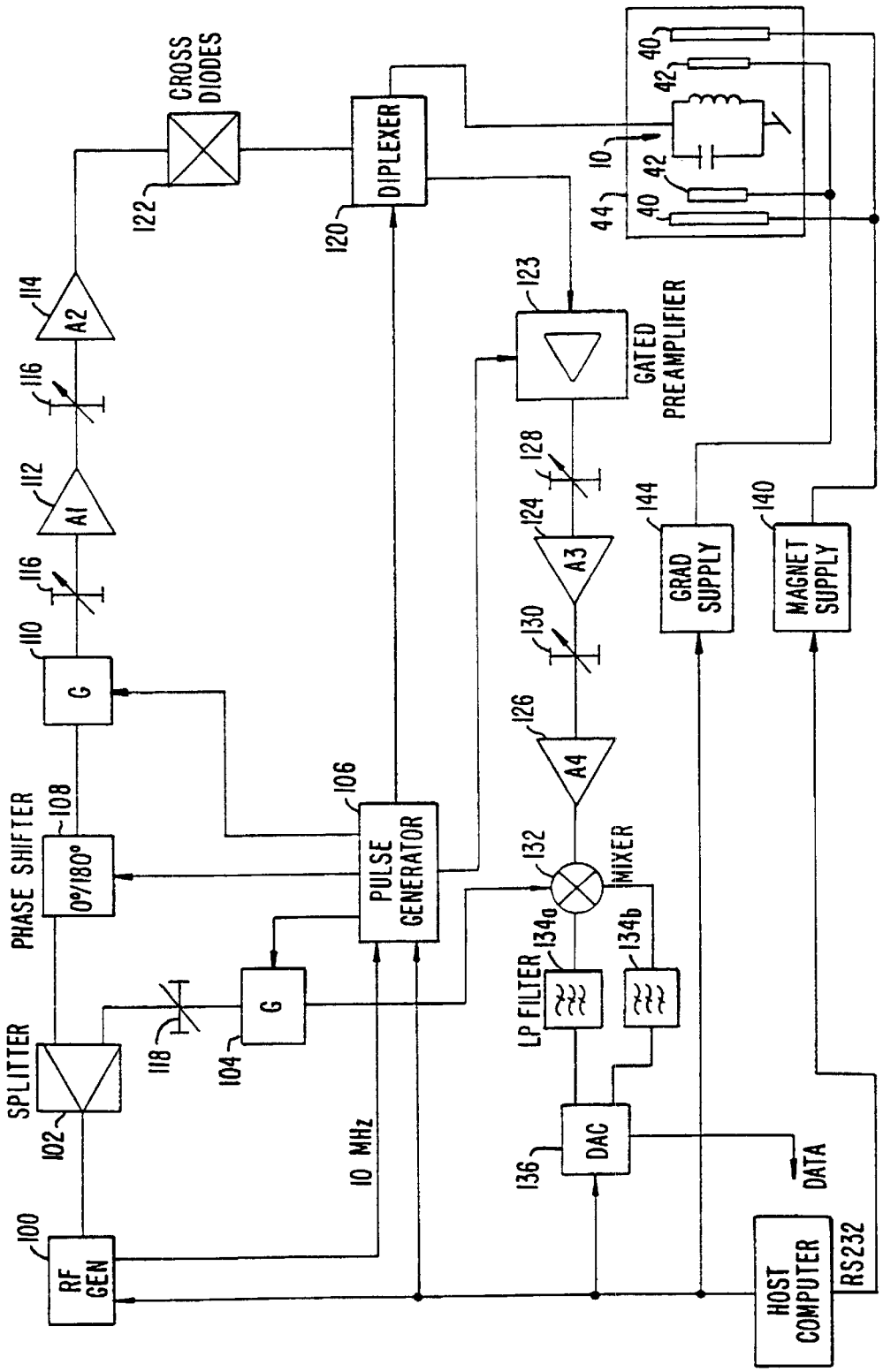
FIG. 7 is a schematic diagram of an EPR spectroscopy system in which the resonant structure of the invention can be utilized.

FIG. 7 is a perspective view of the mounting of the second embodiment of resonator structure 58 in the system. A Helmholtz coil magnet 40 and mounted gradient coils 42 are depicted. The sample assembly 44 can be slid in after loading the sample in the resonator 10. The second embodiment of the resonant structure 58 is mounted in the center position of the magnet 40 when the whole assembly 44 is inserted inside the magnet 40. The sample will be loaded in the cavity 64 of the resonant structure 58. The power to the resonator is given through the coaxial and semirigid cable assembly 16.

The long cylindrical axis 32 of the resonator 58 is parallel to the electromagnet 40 and the induced RF field is perpendicular to the long cylindrical axis. This is an ideal geometry for loading research animals, such as mice or rats, with their body-axis perpendicular to the DC field generated by the electromagnet 40. This parallel coil structure has its RF field axis perpendicular to the axis of either an electromagnet with helmholtz type winding or the axis of a superconducting solenoid in a cryomagnet.

FIG. 7 is a block diagram of the spectrometer/imager. RF power from a Hewlett-Packard (Palo Alto, Calif.) signal generator model HP8644A, 100 is split by a two way-zero degree power splitter (model ZSC-2-1W, Minicircuits, Brooklyn, N.Y.) 102 into two ports, one serving the reference arm and the other the transmitter side. The reference side is gated using RF gate 104. The required gate timing is provided by a cluster of four Digital Delay Generators (model 535, Stanford Research Systems, Sunnyvale, Calif.) 106.

The other arm of the splitter is directed. through a 0/180° phase shifter 108 which can be software controlled using timing pulses from 106. The transmitter pulse is gated through gate 110 and further amplified by RF amplifier 112 (25 db) and further amplified by a power amplifier (ENI 5100L, 100 W) 114. The optimization of the RF power level is accomplished using a set of attenuators 116 and 118. The amplified pulses are coupled with the diplexer T/R switch 120 through a pair of crossed diodes 120 for protection from the reflected power. The diplexer switch 120 receives the timing signal from 106 and the RF pulse is delivered to the resonator 10 (vide infra).

The magnetic induction response from the object in the resonator is first taken through a specially designed gated preamplifier 122 with a low noise high gain (45 dB) capability and a very short saturation recovery time. The preamplifier gate switching is also controlled by 6. The output of the preamplifier is further amplified using amplifiers 124 and 126 with suitable attenuation in between by attenuators 128 and 130 to avoid saturation.

The reference signal from gate 104 and the amplified induction signal from amp 126 are mixed using a double balanced quad mixer 132. The real and imaginary parts are passed through two identical low pass filters 134a and 134b before sampling using a specially designed ultra fast sampler/summer/averager 136. The averaged signal is processed in a Silicon Graphics computer 138 which also controls the overall spectrometer/imager.

The resonance condition is set by changing the current in the DC magnet 20 by the power supply 140 which is addressed by the computer.

For imaging, the spatial/spectral distribution of the spin is frequency encoded by using a set of 3 axes orthogonal field gradient coils 42. The gradient steering is done by software control of the gradient power supply 144.

Figure 8:
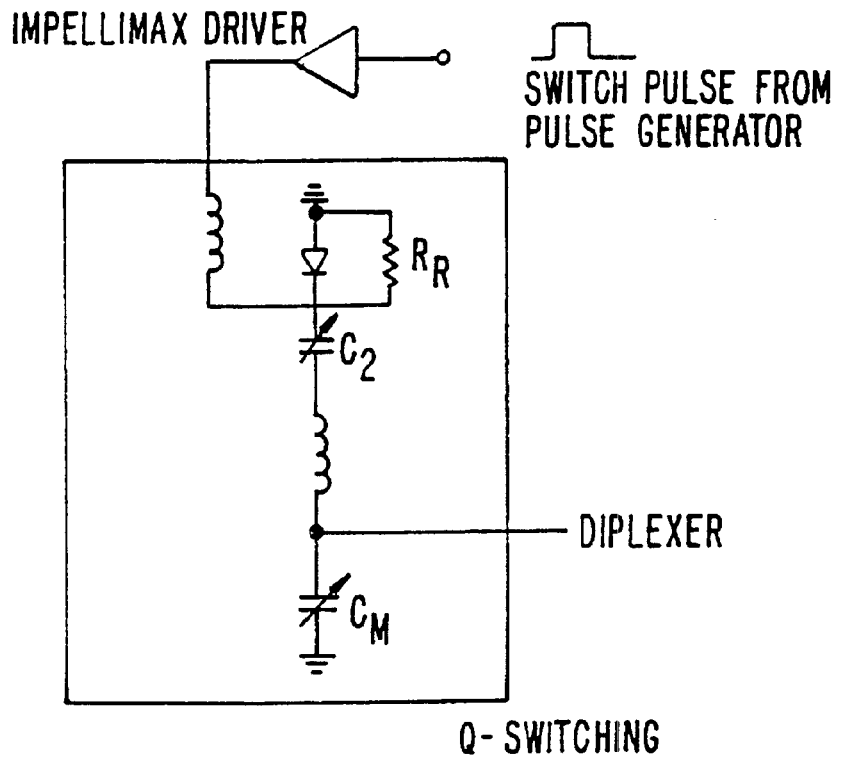
FIGS. 8 and 9 are circuit diagrams depicting a Q-switching circuit.
Figure 9:
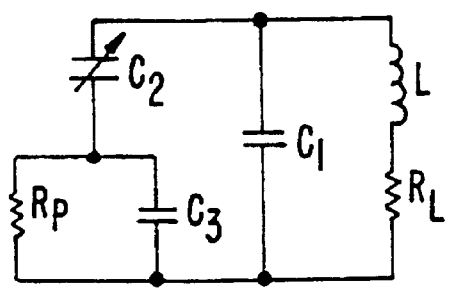

When sensitivity requirements demand high Q, dynamic Q-switching 36 can be used to cut down the resonator ringing time. Schematics of a Q-switching circuit are given in FIGS. 8 and 9. The capacitor $c_2$ is used for tuning and $C_m$ for matching. A non magnetic GaAs beam lead PIN diode from M/A-COM (Burlington, Mass.) is used for Q-switching. In normal mode of operation $R_p$ is effectively the small forward bias resistance of the PIN diode. Q-switching is done by sending a short pulse (20 ns) immediately after the transmit RF pulse. During Q-switching $R_p$ is the large reverse bias resistance of the PIN diode in parallel with $R_R$. By selecting optimum $C_1$, $C_2$, $C_3$ and Rp the total resistance of the network is maximized to minimize the ringdown time constant, $$TAUmin = 2L/(Rmax+RL)$$

where Rmax is given by $$Rmax = ((Rp)opt/2(C1/C2+1)2$$

Thus, during the switching pulse, the Q of the system gets low, thereby enabling faster ring down. However, after the switch pulse the Q becomes normal in the receive cycle for greater sensitivity.

The invention has now been described with reference to the preferred embodiments. Alternatives and substitutions will now be apparent to persons of skill in the art. In particular, although a tube was described as the supporting structure various alternatives such as posts or other supports could be supplied. Additionally, the invention is not limited to a particular EPR spectroscopy system. Therefore, it is not intended to limit the invention except as provided by the appended claims.

What is claimed is:

1. A radiofrequency EPR resonator of a given diameter comprising:

an array of conducting loops of identical diameter, connected in parallel, wherein the said resonator is characterized by a Q-parameter, where the bandwidth of the resonator-response is inversely proportional to the magnitude of Q and the resonator dead time is proportional to the resonator Q, said system further comprising:

Q-switching means, coupled to said resonator and timing controller to receive a Q-switching pulse, for decreasing the Q-value to decrease the resonator dead time.

2. A radiofrequency EPR resonator of a given diameter comprising:

an array of conducting loops of identical diameter, connected in parallel, wherein the said resonator characterized by a switching system by which the Q of the resonator and receiving frequency are shifted as per the imaging requirement.

3. A radiofrequency EPR resonator comprising:

a cylindrical mandrel oriented along a long axis;

a plurality of coil loops, each wound around said mandrel with each loop being parallel to the long axis and spaced apart along said mandrel;

a lead coupled to each of said coil loops and configured to deliver RF energy in parallel to said coil loops, wherein the said resonator is characterized by a Q-parameter, where the bandwidth of the resonator-response is inversely proportional to the magnitude of Q and the resonator dead time is proportional to the resonator Q, said system further comprising:

Q-switching means, coupled to said resonator and timing controller to receive a Q-switching pulse, for decreasing the Q-value to decrease the resonator dead time.

4. A radiofrequency EPR resonator comprising:

a cylindrical mandrel oriented along a long axis;

a plurality of coil loops, each wound around said mandrel with each loop being parallel to the long axis and spaced apart along said mandrel;

a lead coupled to each of said coil loops and configured to deliver RF energy in parallel to said coil loops, wherein the said resonator characterized by a switching system by which the Q of the resonator and receiving frequency are shifted as per the imaging requirement.

* * * * *